(12) United States Patent
Sharma et al.

(10) Patent No.: US 12,538,550 B2
(45) Date of Patent: Jan. 27, 2026

(54) HIGH-ELECTRON-MOBILITY TRANSISTOR WITH FIELD PLATE AND SIDEWALL SPACERS

(71) Applicant: GlobalFoundries U.S. Inc., Malta, NY (US)

(72) Inventors: Santosh Sharma, Austin, TX (US); Michael J. Zierak, Colchester, VT (US); Steven J. Bentley, Menands, NY (US); Mark D. Levy, Williston, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 542 days.

(21) Appl. No.: 18/075,930

(22) Filed: Dec. 6, 2022

(65) Prior Publication Data

US 2024/0186384 A1 Jun. 6, 2024

(51) Int. Cl.
| | |
|---|---|
| *H10D 64/00* | (2025.01) |
| *H10D 30/01* | (2025.01) |
| *H10D 30/47* | (2025.01) |
| *H10D 62/824* | (2025.01) |
| *H10D 62/85* | (2025.01) |
| *H10D 64/01* | (2025.01) |

(52) U.S. Cl.
CPC ......... *H10D 64/111* (2025.01); *H10D 30/015* (2025.01); *H10D 30/475* (2025.01); *H10D 62/824* (2025.01); *H10D 62/8503* (2025.01); *H10D 64/01* (2025.01)

(58) Field of Classification Search
CPC .. H10D 30/015; H10D 30/475; H10D 64/111; H10D 62/824; H10D 62/8503; H10D 64/112; H10D 62/343; H10D 64/256; H10D 30/4732; H01L 29/7786; H01L 29/7783; H01L 29/66462; H01L 29/41766; H01L 29/2003; H01L 29/402; H01L 29/205; H01L 29/401
See application file for complete search history.

(56) References Cited

U.S. PATENT DOCUMENTS

| | | | |
|---|---|---|---|
| 8,168,486 | B2 | 5/2012 | Hebert |
| 8,169,005 | B2 | 5/2012 | Wu et al. |
| 8,283,699 | B2 | 10/2012 | Wu |

(Continued)

FOREIGN PATENT DOCUMENTS

| | | |
|---|---|---|
| CN | 111129138 | 5/2020 |
| CN | 113823675 | 12/2021 |

OTHER PUBLICATIONS

Specification and Drawings filed on Oct. 12, 2022 in related U.S. Appl. No. 17/964,356, 25 pages.

(Continued)

*Primary Examiner* — William B Partridge
*Assistant Examiner* — David Paul Sedorook
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a high-electron-mobility transistor (HEMT) and methods of manufacture. The structure includes: a gate structure; a source contact and a drain contact adjacent to the gate structure; and a field plate electrically isolated from the gate structure and abutting the source contact and the drain contact.

20 Claims, 3 Drawing Sheets

(56) References Cited

U.S. PATENT DOCUMENTS

| | | |
|---|---|---|
| 8,404,508 B2 | 3/2013 | Lidow et al. |
| 9,525,055 B2 | 12/2016 | Kudymov et al. |
| 9,590,069 B2 | 3/2017 | Dasgupta et al. |
| 10,847,644 B2 | 11/2020 | Kinzer et al. |
| 2008/0308813 A1 | 12/2008 | Suh et al. |
| 2015/0028388 A1* | 1/2015 | Majumdar ........... H10D 30/475 257/192 |
| 2019/0140086 A1 | 5/2019 | Chikamatsu |
| 2019/0267456 A1* | 8/2019 | Chen .................... H10D 30/015 |
| 2019/0288112 A1* | 9/2019 | Wang .................... H10D 30/65 |
| 2021/0111254 A1* | 4/2021 | Jones ................... H10D 64/112 |

OTHER PUBLICATIONS

European Search Report and Opinion dated Mar. 28, 2024 in EP Application No. 23206289.3-1212, 8 pages.

* cited by examiner

HIGH-ELECTRON-MOBILITY TRANSISTOR WITH FIELD PLATE AND SIDEWALL SPACERS

This invention was made with government support under Contract #HQ0727790700 awarded by the Defense Microelectronics Agency (DMEA). The government has certain rights in the invention.

BACKGROUND

The present disclosure relates to semiconductor structures and, more particularly, to a high-electron-mobility transistor (HEMT) and methods of manufacture.

A HEMT is a field-effect transistor incorporating a junction between two materials with different band gaps (i.e. a heterojunction) as the channel, instead of a doped region (as is generally the case for a MOSFET). Commonly used material combinations are GaN or GaAs, although other materials can be used dependent on the application of the device.

HEMTs are able to operate at higher frequencies than ordinary transistors, up to millimeter wave frequencies. As the HEMTs are able to operate at higher frequencies, they can be used in high-frequency products such as cell phones, satellite television receivers, voltage converters, and radar equipment. For example, a HEMT may be used in satellite receivers and in low power amplifiers.

To optimize a GaN power HEMT, it is necessary to reduce gate to drain spacing. This may be accomplished by the use of field plates. The field plates, though, can cause a distributed RC effect especially under high frequency high dvdt switching environments.

SUMMARY

In an aspect of the disclosure, a structure comprises: a gate structure; a source contact and a drain contact adjacent to the gate structure; and a field plate electrically isolated from the gate structure and abutting the source contact and the drain contact.

In an aspect of the disclosure, a structure comprises: a gate structure; a gate metal contact electrically connecting to the gate structure; a source contact connecting to a source region of the gate structure; a drain contact connecting to a drain region of the gate structure; and a field plate electrically isolated from the gate metal contact and contacting the source contact and the drain contact.

In an aspect of the disclosure, a method comprises: forming a gate structure; forming a source contact and a drain contact adjacent to the gate structure; and forming a field plate electrically isolated from the gate structure and abutting the source contact and the drain contact.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a high-electron-mobility transistor (HEMT) and methods of manufacture. More specifically, the HEMT includes a field plate placed close to the surface of a channel region of the device, e.g., AlGaN/GaN layer, and which abuts (contacts) ohmic contacts of the drain region and source region of the HEMT. Advantageously, the present disclosure provides better switching response and alleviates field reduction at a drain region of the device.

In more specific embodiments, the HEMT may be a high voltage GaN device. The HEMT includes a field plate placed close to the surface of the channel region (e.g., two materials with different band gaps such as AlGaN/GaN) and abutting (e.g., contacting) a drain ohmic contact and a source ohmic contact. The field plate also has a section adjacent to the gate structure, between the source region and the drain region. The section adjacent to the gate structure is isolated from a gate metal contact by a sidewall spacer.

The HEMT of the present disclosure can be manufactured in a number of ways using a number of different tools. In general, though, the methodologies and tools are used to form structures with dimensions in the micrometer and nanometer scale. The methodologies, i.e., technologies, employed to manufacture the HEMT of the present disclosure have been adopted from integrated circuit (IC) technology. For example, the structures are built on wafers and are realized in films of material patterned by photolithographic processes on the top of a wafer. In particular, the fabrication of the HEMT uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
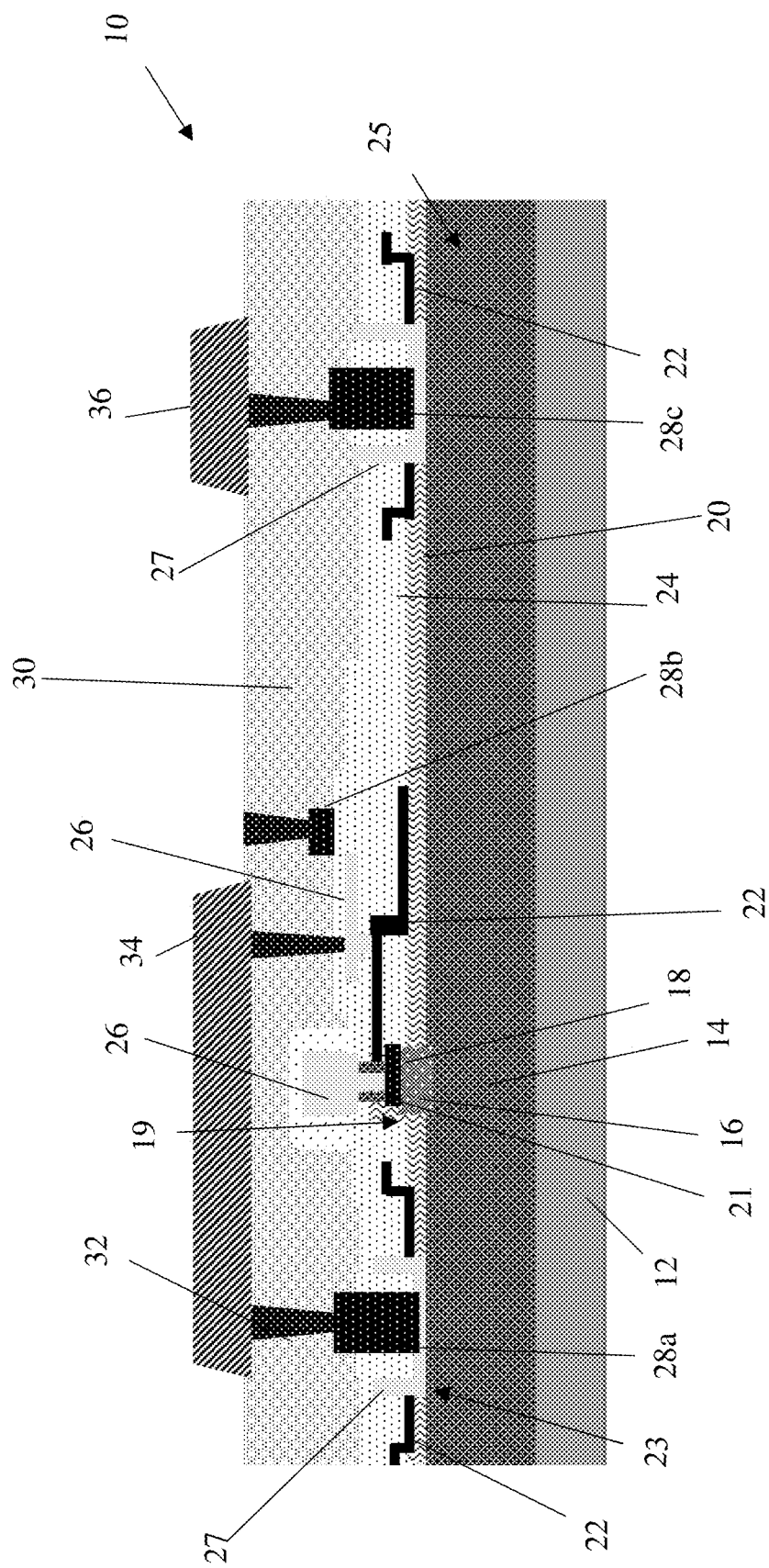
FIG. 1 shows a HEMT device and respective fabrication processes in accordance with aspects of the present disclosure.

FIG. 1 shows a HEMT and respective fabrication processes in accordance with aspects of the present disclosure. More specifically, the structure 10 of FIG. 1 includes a semiconductor substrate 12 with a semiconductor material 14 on the semiconductor substrate 12. The semiconductor material 14 may be two materials with different band gaps, i.e., AlGaN/GaN, which may act as a conducting channel (active region) for the HEMT device. The semiconductor substrate 12 may be composed of any suitable material including, but not limited to, Si, SiGe, SiGeC, SiC, GaAs, InAs, InP, and other III/V or II/VI compound semiconductors. In preferred embodiments, the semiconductor substrate 12 comprises p-type Si material with a suitable crystal orientation, e.g., (111).

A semiconductor material 16 and conductive material 18 may be formed, e.g., deposited and patterned, on the semiconductor material 14. In embodiments, the semiconductor material 16 comprises, e.g., p-doped GaN, and the conductive material 18 may be, e.g., TiN. The combination of the semiconductor material 16 and the conductive material 18 comprises a gate structure 19. The semiconductor material 16 may be epitaxially grown on the semiconductor material 14 with an in-situ doping, e.g., p-type doping, as is known in the art. The conductive material 18 may be deposited by a conventional deposition method (e.g., chemical vapor deposition (CVD)), followed by conventional lithography and etching processes for both materials 16, 18 in order to pattern the gate structure 19. In embodiments, the conductive material 18 may be pulled back slightly.

Still referring to FIG. 1, an insulator material (passivation layer) 20 may be formed over the gate structure 19 and the semiconductor material 14. The insulator material 20 may be, e.g., $SiO_2$. The insulator material 20 may be deposited by conventional deposition methods over the gate structure 19 and semiconductor material 14. A field plate 22 may be formed in contact with insulator material 20. In more specific embodiments, the field plate 22 may comprise TiN formed over the insulator material 20. The field plate 22 may be a common field plate for the gate structure 19, a source region 23 and a drain region 25. The field plate 22 may be provided in a stepped configuration with a portion close to the semiconductor material 14 within the source region 23 and the drain region 25 due to the field plate 22 being formed at least partly on the insulator material 20.

In embodiments, the field plate 22 may physically contact (e.g., abut) an ohmic metal 27 of the source region 23 and the drain region 25. In further embodiments, the field plate 22 may surround the ohmic metal 27 of the source region 23 and the drain region 25. In this way, the field plate 22 will reduce the peak field (e.g., field crowding) at the edge of the drain region 25. In addition, the field plate 22 can provide a uniform field distribution, reduce resistance impact and provide improved device performance. The ohmic metal 27 electrically contacts (and may be in physical contact) to the semiconductor material 14 (e.g., conducting channel region). It should be understood by those of skill in the art that the ohmic metal 27 may be other shapes including, for example, a via contact that extends to the semiconductor material 14.

The field plate 22 may also be separated (e.g., electrically isolated) from a gate metal 26 by sidewall spacers 21 formed on sidewalls of the gate contact metal 26. The gate contact metal 26 electrically connects (contacts) to the gate structure 19 and, more specifically, contacts the conductive material 18. That is, the gate contact metal 26 may be formed in physical contact with the conductive material 18, e.g., TiN, of the gate structure 19. The field plate 22 may be electrically isolated and physically separated from the gate structure 19 and, more specifically, the gate contact metal 26, by the sidewall spacers 21.

An interlevel dielectric material 24, e.g., layers of oxide and/or nitride, may be formed over the field plate 22 (and partially under the field plate 22). The gate contact metal 26 may be, e.g., TiAl or TiN, formed by patterning of the interlevel dielectric material 24 to form a trench and which exposes the conductive material 18, e.g., TiN, followed by deposition of conductive material, e.g., TiAl or TiN. In embodiments, the gate contact metal 26 and the ohmic metal 27 may be the same metal materials formed in similar processes, e.g., conventional CMOS processes. Prior to forming the gate contact metal 26, sidewall spacers 21 (e.g., nitride and/or oxide material) may be blanket deposited (e.g., lined) in the trench by a conventional deposition process, e.g., CVD, followed by a conventional etching process.

Still referring to FIG. 1, ohmic contacts 28a, 28c may contact (e.g., electrically connect) to the underlying semiconductor material 14 (e.g., conducting channel) by way of the ohmic contacts 27. It should be understood by those of skill in the art that the ohmic contacts 27 may be eliminated and that the ohmic contacts 28a, 28c may directly connect to the source region 23 and drain region 25 (e.g., semiconductor material 14). The ohmic contact 28b may contact the gate contact metal 26.

An interlevel dielectric material 30 may be formed over the interlevel dielectric material 24. Back end of the line contacts (e.g., metal vias) 32 may connect to the ohmic contacts 28a-28c. The back end of the line contacts 32 may also contact the field plate 22 through the gate contact metal 26. The ohmic contacts 28a-28c may comprise, e.g., TiAl or TiN. Metal wiring 34, 36 connect to the source region 23 and the drain region 25, respectively. In embodiments, the metal wiring 34, 36 may electrically connect and be in direct contact with the via contacts 32 for the source region 23 and the drain region 25.

Figure 2A:
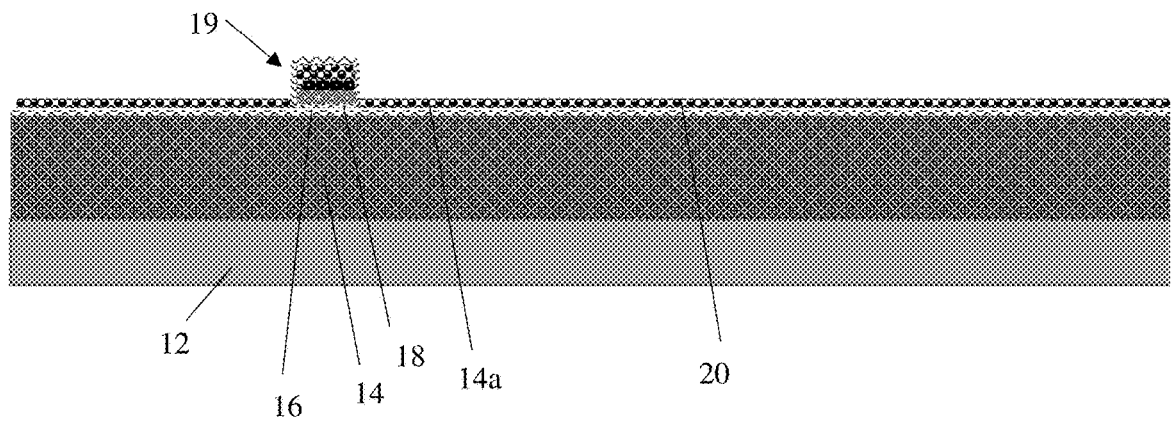
FIGS. 2A-2D show fabrication processes for manufacturing the device shown in FIG. 1 in accordance with aspects of the present disclosure.

FIGS. 2A-2D show fabrication processes for manufacturing the device shown in FIG. 1 in accordance with aspects of the present disclosure. In FIG. 2A, the semiconductor material 14 may be formed on the semiconductor substrate 12. The semiconductor material 14 may be deposited on the semiconductor substrate 12 using any conventional deposition method, e.g., CVD or epitaxial growth processes. The semiconductor material 14 may include an active layer 14a (e.g., GaN and/or AlGaN) formed by deposition or epitaxial growth processes as is known in the art.

Further, the gate structure 19 may be formed on the active layer 14a by epitaxially growing the semiconductor material 16, e.g., GaN, on the active layer 14a. In embodiments, an in-situ doping (e.g., p-type dopant) may be used during the epitaxial growth process. The conductive material 18 may be formed on the semiconductor material 16, e.g., GaN, by a deposition process, e.g., CVD. The conductive material 18 and the semiconductor material 16, e.g., GaN, may be patterned using conventional lithography and etching processes as described herein to form the gate structure 19. The insulator material 20 may be formed over the gate structure 19 using conventional deposition methods, e.g., CVD.

Figure 2B:
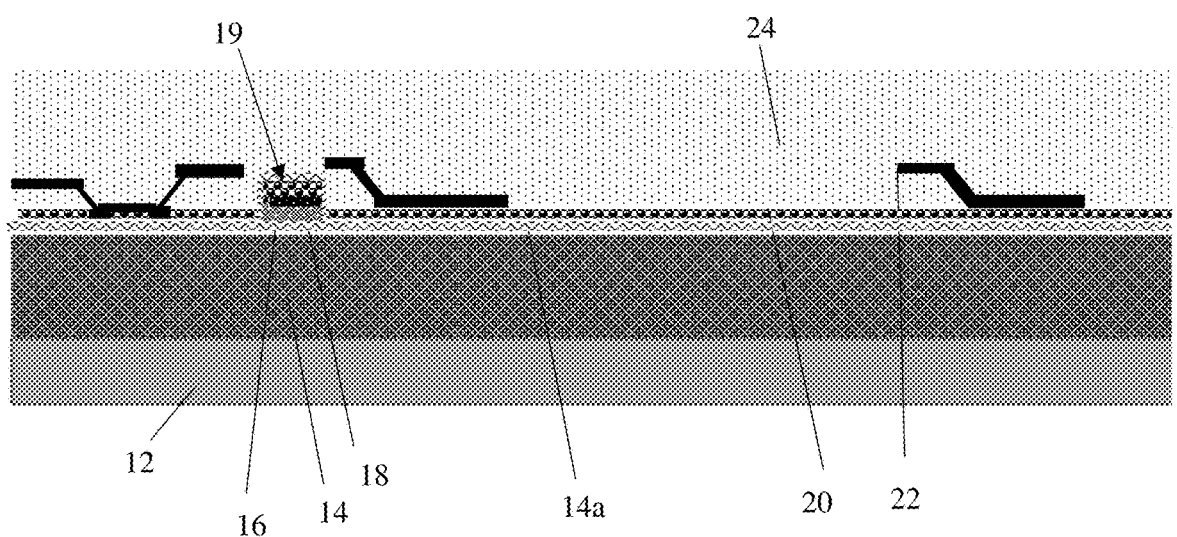

In FIG. 2B, dielectric material 24 may be deposited on the insulator material 20, and patterned with the insulator material 20 prior to the formation of the field plate 22. In the patterning process, the dielectric material 24 and, in embodiments, the insulator material 20 may be etched so that the field plate 22 may be deposited close to semiconductor material 14 (e.g., active layer 14a) in the source region 23 and the drain region 25 (forming a stepped pattern). The field plate 22 may be blanket deposited over the gate structure 19 and the insulator materials 20, 24 in the source region 23 and the drain region 25 using conventional deposition methods, e.g., CVD. A conventional patterning process may be used to pattern the field plate 22 to form gaps in the field plate 22 between the source contact, the drain contact and the gate structure. After the field plate 22 is patterned, additional dielectric material 24 may be deposited on the field plate 22.

Figure 2C:
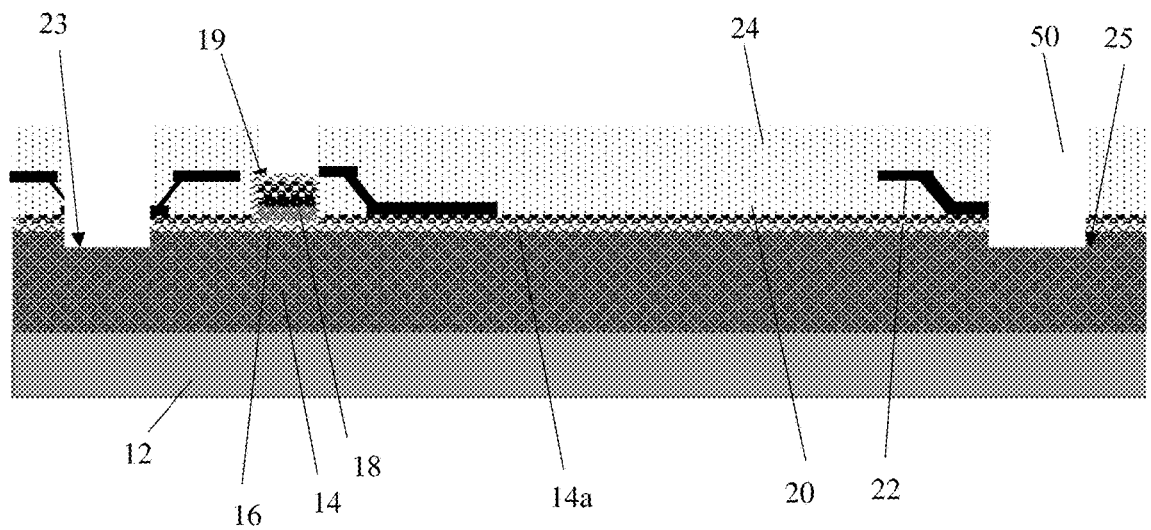

In FIG. 2C, trenches 50 may be formed in the dielectric material 24, exposing the conductive material 18 of the gate structure 19, in addition to exposing the semiconductor material 14 in the source region 23 and the drain region 25. The trenches 50 may be formed through the patterned field plate 22. The trenches 50 may be formed by conventional lithography and etching methods known to those of skill in the art. For example, a resist formed over the dielectric material 24 is exposed to energy (light) and developed utilizing a conventional resist developer to form a pattern (opening). An etching process with a selective chemistry, e.g., reactive ion etching (RIE), will be used to transfer the pattern into the dielectric material 24 (and other materials, e.g. insulator material 20) depending on the depth form one or more trenches 50.

Figure 2D:
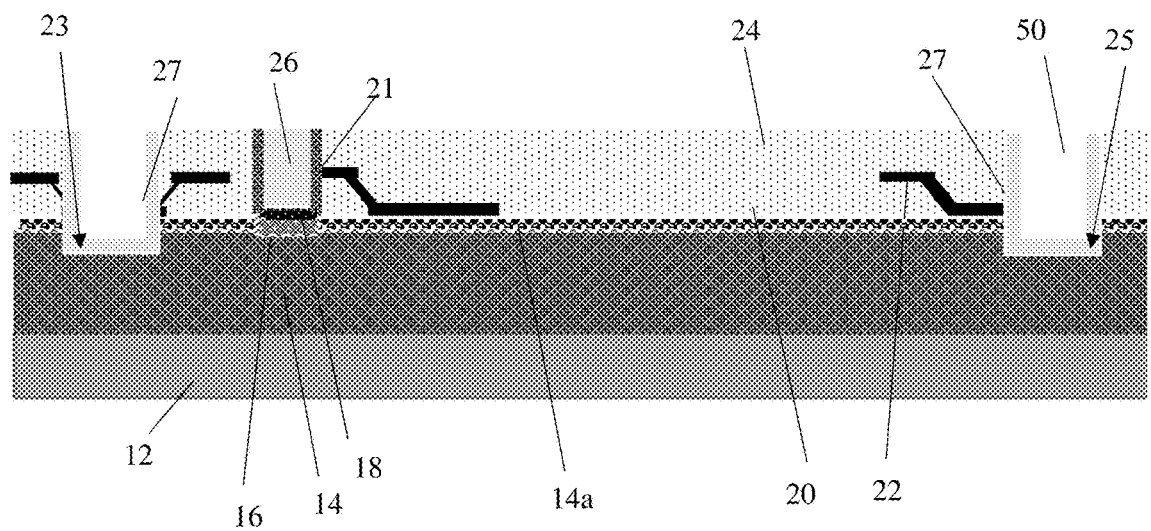

As shown in FIG. 2D, the sidewall spacers 21 are formed in the trench above the gate structure 19. The sidewall spacers 21 can be formed by a deposition of nitride and/or oxide by a CVD process, followed by an anisotropic etching process. The gate metal contact 26 may be formed over the sidewall spacers 21 by a conventional deposition method, e.g., CVD. The ohmic contacts 27 may also be formed in the trenches 50, in contact with the semiconductor material 14 in the source region 23 and the drain region 25. In embodiments, the gate metal contact 26 and the ohmic contacts 27 may be formed in the same deposition process, followed by a chemical mechanical polishing (CMP) process to remove any excessive conductive material on the dielectric material 24.

Referring back to FIG. 1, an interlevel dielectric material 30 may be formed over the interlevel dielectric material 24 using conventional deposition methods, e.g., CVD. The back end of the line contacts 32 and the ohmic contacts 28a-28c may be formed using conventional lithography, etching and deposition processes as is known in the art. The ohmic contacts 28a-28c may comprise, e.g., TiAl or TiN. The metal wirings 34, 36 to the source region 23 and the drain region 25 may be formed by back end of the line metal processes (e.g., TiN liner with tungsten fill) as is known in the art such that no further explanation is required for a complete understanding of the present disclosure.

The HEMT can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a gate structure comprising semiconductor material and conductive material;
   a gate contact metal contacting the conductive material;
   a sidewall spacer above the conductive material and surrounding the gate contact metal;
   a source contact and a drain contact adjacent to the gate structure; and
   a field plate electrically isolated from the gate structure by the sidewall spacer surrounding the gate contact metal, and the field plate physically contacting the source contact and the drain contact.

2. The structure of claim 1, wherein the gate contact metal is electrically connected to the gate structure, and the field plate is electrically isolated from and below a top surface of the gate contact metal.

3. The structure of claim 2, wherein the sidewall spacer is on a sidewall of the gate contact metal, and the gate contact metal comprising an upper portion and a lower portion, the upper being wider than the lower portion and the field plate is electrically isolated from the gate contact by the sidewall spacer at the lower portion, below the upper portion.

4. The structure of claim 3, wherein the field plate abuts the sidewall spacer.

5. The structure of claim 1, wherein the gate structure comprises pGaN material.

6. The structure of claim 5, wherein the source contact and the drain contact connect to a source region and a drain region, respectively, comprising AlGaN/GaN material.

7. The structure of claim 6, wherein the field plate is separated from the source region and the drain region by a passivation layer and comprises a stepped feature above the passivation layer.

8. The structure of claim 1, wherein the field plate surrounds the source contact and the drain contact.

9. The structure of claim 1, wherein the source contact and the drain contact comprise ohmic contacts physically contacting to a source region and a drain region, respectively, and comprising AlGaN/GaN material.

10. The structure of claim 1, wherein the field plate is a common patterned field plate contacting the source contact and the drain contact and abutting a sidewall spacer of a gate contact.

11. A structure comprising:
    a gate structure;
    a gate metal contact electrically connecting to the gate structure;
    a source contact connecting to a source region of the gate structure;
    a drain contact connecting to a drain region of the gate structure; and
    a field plate electrically isolated from the gate metal contact and contacting the source contact and the drain contact by a sidewall spacer surrounding the gate metal contact.

12. The structure of claim 11, wherein the sidewall spacer is on sidewalls of the gate metal contact.

13. The structure of claim 12, wherein the field plate field plate contacts the sidewall spacer, and the gate metal contact comprises an upper portion and a lower portion, the upper being wider than the lower portion and the field plate is electrically isolated from the gate contact by the sidewall spacer at the lower portion, below the upper portion.

14. The structure of claim 11, wherein the gate structure comprises pGaN material, and the source region and the drain region comprise AlGaN/GaN material.

15. The structure of claim 14, wherein the field plate is separated from the source region and the drain region by a passivation layer, and the field plate includes a stepped feature above the passivation layer.

16. The structure of claim 14, wherein the source contact and the drain contact comprise ohmic contacts physically contacting the source region and the drain region, respectively.

17. The structure of claim 11, wherein the field plate surrounds the source contact and the drain contact.

18. The structure of claim 11, wherein the field plate is a common patterned field plate contacting the source contact and the drain contact and separated from the gate contact on at least one side.

19. The structure of claim 11, wherein a gap is provided in the field plate between the source contact, the drain contact and the gate structure.

20. A method comprising:
- forming a gate structure comprising semiconductor material and conductive material;
- forming a gate contact metal contacting the conductive material;
- forming a sidewall spacer above the conductive material and surrounding the gate contact metal;
- forming a source contact and a drain contact adjacent to the gate structure; and
- forming a field plate electrically isolated from the gate structure by the sidewall spacer surrounding the gate contact metal, and the field plate physically contacting the source contact and the drain contact.

* * * * *